(12) United States Patent
Lui et al.

(10) Patent No.: US 7,795,952 B2
(45) Date of Patent: Sep. 14, 2010

(54) REGULATION OF RECOVERY RATES IN CHARGE PUMPS

(75) Inventors: Man Lung Lui, Santa Clara, CA (US);
Seungpil Lee, San Ramon, CA (US);
Hao Thai Nguyen, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 7 days.

(21) Appl. No.: 12/337,050

(22) Filed: Dec. 17, 2008

(65) Prior Publication Data

US 2010/0148856 A1 Jun. 17, 2010

(51) Int. Cl.
*G05F 1/10* (2006.01)
(52) U.S. Cl. .......................................... 327/536; 363/60
(58) Field of Classification Search ................. 327/536; 363/59–60
See application file for complete search history.

(56) References Cited

U.S. PATENT DOCUMENTS

| | | | |
|---|---|---|---|
| 3,697,860 A | 10/1972 | Baker | |
| 4,511,811 A | 4/1985 | Gupta | |
| 4,583,157 A | 4/1986 | Kirsch et al. | |
| 4,636,748 A | 1/1987 | Latham | |
| 4,736,121 A | 4/1988 | Cini et al. | |
| 4,888,738 A | 12/1989 | Wong et al. | |
| 5,168,174 A * | 12/1992 | Naso et al. | 327/540 |
| 5,175,706 A * | 12/1992 | Edme | 365/226 |
| 5,263,000 A | 11/1993 | Van Buskirk et al. | |
| 5,392,205 A | 2/1995 | Zavaleta | |
| 5,436,587 A | 7/1995 | Cernea | |
| 5,483,434 A * | 1/1996 | Seesink | 363/60 |
| 5,508,971 A | 4/1996 | Cernea et al. | |
| 5,521,547 A | 5/1996 | Tsukada | |

(Continued)

FOREIGN PATENT DOCUMENTS

EP 0 382 929 A 8/1990

(Continued)

OTHER PUBLICATIONS

Feng Pan et al., "Charge Pump Circuit Design", McGraw-Hill, 2006, 26 pages.

(Continued)

*Primary Examiner*—Lincoln Donovan
*Assistant Examiner*—Thomas J Hiltunen
(74) *Attorney, Agent, or Firm*—Davis Wright Tremaine LLP

(57) ABSTRACT

A method is presented of setting a frequency of a clock for a charge pump system including the clock and a charge pump. This includes setting an initial value for the frequency of the clock and, while operating the charge pump system using the clock running at the initial frequency value, determining the ramp rate of an output voltage for the charge pump during a recovery phase. The frequency of the clock is then adjusted so that the ramp rate of the output voltage for the charge pump during the recovery phase falls in a range not exceeding a predetermined maximum rate. A charge pump system is also described that includes a register having a settable value, where the charge pump clock frequency is responsive to the register value, and count and comparison circuitry is connectable to receive the pump's output voltage and the clock signal and determine from them the number of clock cycles the charge pump uses to recover from a reset value to a predetermined value.

13 Claims, 3 Drawing Sheets

U.S. PATENT DOCUMENTS

| | | | |
|---|---|---|---|
| 5,563,779 A | 10/1996 | Cave et al. | |
| 5,563,825 A | 10/1996 | Cernea et al. | |
| 5,568,424 A | 10/1996 | Cernea et al. | |
| 5,592,420 A | 1/1997 | Cernea et al. | |
| 5,596,532 A | 1/1997 | Cernea et al. | |
| 5,621,685 A | 4/1997 | Cernea et al. | |
| 5,625,544 A | 4/1997 | Kowshik et al. | |
| 5,693,570 A | 12/1997 | Cernea et al. | |
| 5,734,286 A * | 3/1998 | Takeyama et al. | 327/295 |
| 5,818,766 A * | 10/1998 | Song | 365/189.11 |
| 5,969,565 A | 10/1999 | Naganawa | |
| 5,973,546 A | 10/1999 | Le et al. | |
| 5,982,222 A | 11/1999 | Kyung | |
| 6,018,264 A | 1/2000 | Jin | |
| 6,023,187 A | 2/2000 | Camacho et al. | |
| 6,026,002 A | 2/2000 | Viehmann | |
| 6,104,225 A | 8/2000 | Taguchi et al. | |
| 6,134,145 A | 10/2000 | Wong | |
| 6,154,088 A | 11/2000 | Chevallier et al. | |
| 6,198,645 B1 | 3/2001 | Kotowski et al. | |
| 6,208,198 B1 | 3/2001 | Lee | |
| 6,249,445 B1 * | 6/2001 | Sugasawa | 363/60 |
| 6,249,898 B1 | 6/2001 | Koh et al. | |
| 6,285,622 B1 | 9/2001 | Taraguchi et al. | |
| 6,314,025 B1 | 11/2001 | Wong | |
| 6,329,869 B1 | 12/2001 | Matano | |
| 6,344,959 B1 | 2/2002 | Milazzo | |
| 6,344,984 B1 | 2/2002 | Miyazaki | |
| 6,370,075 B1 | 4/2002 | Haeberli et al. | |
| 6,400,202 B1 | 6/2002 | Fifield et al. | |
| 6,404,274 B1 | 6/2002 | Hosono et al. | |
| 6,424,570 B1 | 7/2002 | Le et al. | |
| 6,445,243 B2 | 9/2002 | Myono | |
| 6,456,170 B1 | 9/2002 | Segawa et al. | |
| 6,486,728 B2 | 11/2002 | Kleveland | |
| 6,518,830 B2 | 2/2003 | Gariboldi et al. | |
| 6,525,614 B2 * | 2/2003 | Tanimoto | 331/20 |
| 6,525,949 B1 | 2/2003 | Johnson et al. | |
| 6,531,792 B2 | 3/2003 | Oshio | |
| 6,556,465 B2 | 4/2003 | Haeberli et al. | |
| 6,577,535 B2 | 6/2003 | Pasternak | |
| 6,606,267 B2 | 8/2003 | Wong | |
| 6,724,241 B1 | 4/2004 | Bedarida et al. | |
| 6,734,718 B1 | 5/2004 | Pan | |
| 6,760,262 B2 | 7/2004 | Haeberli et al. | |
| 6,798,274 B2 | 9/2004 | Tanimoto | |
| 6,834,001 B2 | 12/2004 | Myono | |
| 6,859,091 B1 | 2/2005 | Nicholson et al. | |
| 6,891,764 B2 | 5/2005 | Li | |
| 6,894,554 B2 * | 5/2005 | Ito | 327/536 |
| 6,922,096 B2 | 7/2005 | Cernea | |
| 6,944,058 B2 | 9/2005 | Wong | |
| 6,975,135 B1 | 12/2005 | Bui | |
| 6,990,031 B2 | 1/2006 | Hashimoto et al. | |
| 7,023,260 B2 | 4/2006 | Thorp et al. | |
| 7,030,683 B2 | 4/2006 | Pan et al. | |
| 7,113,023 B2 | 9/2006 | Cernea | |
| 7,116,155 B2 | 10/2006 | Pan | |
| 7,120,051 B2 | 10/2006 | Gorobets et al. | |
| 7,135,910 B2 | 11/2006 | Cernea | |
| 7,227,780 B2 | 6/2007 | Komori et al. | |
| 7,239,192 B2 | 7/2007 | Tailliet | |
| 7,253,676 B2 * | 8/2007 | Fukuda et al. | 327/536 |
| 7,276,960 B2 | 10/2007 | Peschke | |
| 7,397,677 B1 | 7/2008 | Collins et al. | |
| 7,468,628 B2 | 12/2008 | Im et al. | |
| 7,579,903 B2 * | 8/2009 | Oku | 327/538 |
| 7,671,572 B2 * | 3/2010 | Chung | 323/283 |
| 2003/0128560 A1 | 7/2003 | Saiki et al. | |
| 2005/0248386 A1 | 11/2005 | Pan et al. | |
| 2006/0114053 A1 | 6/2006 | Sohara et al. | |
| 2007/0001745 A1 | 1/2007 | Yen | |
| 2007/0069805 A1 * | 3/2007 | Choi et al. | 327/536 |
| 2007/0126494 A1 | 6/2007 | Pan | |
| 2007/0139099 A1 | 6/2007 | Pan | |
| 2007/0139100 A1 | 6/2007 | Pan | |
| 2007/0222498 A1 * | 9/2007 | Choy et al. | 327/536 |
| 2007/0229149 A1 | 10/2007 | Pan et al. | |
| 2008/0024096 A1 | 1/2008 | Pan | |
| 2008/0157852 A1 | 7/2008 | Pan | |
| 2008/0157859 A1 | 7/2008 | Pan | |
| 2008/0239802 A1 | 10/2008 | Thorpe | |
| 2008/0239856 A1 | 10/2008 | Thorpe | |
| 2009/0091366 A1 * | 4/2009 | Baek et al. | 327/332 |

FOREIGN PATENT DOCUMENTS

| | | |
|---|---|---|
| EP | 0 780 515 A | 6/1997 |
| WO | 01/06336 A1 | 1/2001 |
| WO | WO 2006/132757 | 12/2006 |

OTHER PUBLICATIONS

Louie Pylarinos et al., "Charge Pumps: An Overview", Department of Electrical and Computer Engineering University of Toronto, 7 pages.

Ang et al., "An On-Chip Voltage Regulator Using Switched Decoupling Capacitors," 2000 IEEE International Solid-State Circuits Conference, 2 pages.

Notification of Transmittal of the International Search Report and the Written Opinion of the International Searching Authority, or the Declaration, Application No. PCT/US2009/066268, mailed Mar. 18, 2010, 14 pages.

\* cited by examiner

REGULATION OF RECOVERY RATES IN CHARGE PUMPS

FIELD OF THE INVENTION

This invention pertains generally to the field of charge pumps and more particularly to methods of governing the rate of recovery in charge pumps.

BACKGROUND

Charge pumps use a switching process to provide a DC output voltage larger than its DC input voltage. In general, a charge pump will have a capacitor coupled to switches between an input and an output. During one clock half cycle, the charging half cycle, the capacitor couples in parallel to the input or power supply voltage so as to charge up to the input voltage. During a second clock cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

Charge pumps are used in many contexts. For example, they are used as peripheral circuits on flash memory and other non-volatile memories to generate many of the needed operating voltages, such as programming or erase voltages, from a lower power supply voltage. A number of charge pump designs are known in the art and these use a regulation scheme to provide the desired output level. As the accuracy of the output can be important for the application in which it is being used, and as the accuracy of the output level depends on the regulation of the charge pump, there are consequently often needs to improve the ability of the regulation to track the output level.

SUMMARY OF THE INVENTION

An exemplary embodiment presents a method of setting a frequency of a clock for a charge pump system including the clock and a charge pump. This includes setting an initial value for the frequency of the clock and, while operating the charge pump system using the clock running at the initial frequency value, determining the ramp rate of an output voltage for the charge pump during a recovery phase. The frequency of the clock is then adjusted so that the ramp rate of the output voltage for the charge pump during the recovery phase falls in a range not exceeding a predetermined maximum rate.

According to another aspect, a charge pump system is presented. The system includes a clock circuit to provide a clock signal, a charge pump to provide an output voltage, where the charge pump is connected receive the clock signal and operate at the clock circuit's frequency, and a regulator circuit connected receive the output voltage and provide a regulation voltage derived from the output voltage to the charge pump. The system also includes a register having a settable value, where the clock frequency is responsive to the register value, and count and comparison circuitry connectable to receive the output voltage and the clock signal and determine from them the number of clock cycles the charge pump uses to recover from a reset value to a predetermined value.

Various aspects, advantages, features and embodiments of the present invention are included in the following description of exemplary examples thereof which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

Figure 1A:
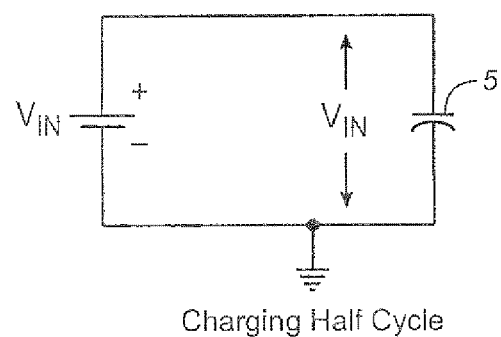
FIG. 1a is a simplified circuit diagram of the charging half cycle in a generic charge pump.
Figure 1B:
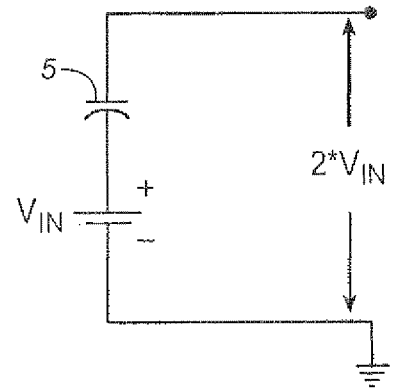
FIG. 1b is a simplified circuit diagram of the transfer half cycle in a generic charge pump.

In a typical charge pump system, the charge pump will have several stages and the rate at which these switch between the charging half cycle of FIG. 1A and the transfer half cycle of FIG. 1B is set by the clock frequency supplied to the pump. As the pump system is intended to supply a certain output voltage at a sufficient current level, and quickly return to and maintain these levels when the output is applied to a load, the pump system is designed to meet the required specification. In contrast to a typical pump system, which is designed to recover to the prescribed levels above a certain rate, the system and methods described here present a charge pump system where the clock frequency is trimmable so that the rate of recovery does not recover too rapidly.

Due to the differ location and conditions on a circuit being supplied by a charge pump, as well as die-to-die variations, the actual ramp rate of the level supplied from the pump output when it arrives at different elements can vary significantly. In the typical current design, the pump designer will need to guarantee that the ramp rate meets a minimum value in the spec for the "slowest" elements for performance proposed. However, meeting this minimum performance for the "slowest" elements makes the ramp rate in the "fastest" supply condition very fast. (For example, in the case of a non-volatile memory device where the various elements of the memory array will, due to path differences from the pump output to different memory cells, experience slower or faster ramp rates when driven by the pump. Different parts of the array would get different level from same pump.) It has been observed that if the ramp rate is too fast, this can lead undesirable results.

To stay with the non-volatile memory device example, it has been observed in silicon that too a fast ramp rate on a charge pump's output could cause some issues read disturbs such as hot electron injection into memory cells. In an exemplary embodiment, to resolve such hot electron injection related failures, the system uses a slowed down (relative to maximum available value) pump clock such that the ramp rate is slower. Thus, rather than just considering a ramp rate above some minimum value, a maximum ramp rate is also considered and the pump clock adjusted accordingly. In most applications, this may also lead to the timing budget being elongated due to the ramp rate of pump output being is too slow for the slowest elements using the pump output. As the ramp rate can be controlled by the pump clock frequency, instead of having a fixed pump clock frequency for every die, according to one aspect presented here, the system uses a trimmable clock frequency, trimming the pump clock frequency by checking the ramp rate of the output.

In one exemplary embodiment for the current pump design, a voltage detector circuit generates a "flag" signal to count how much time it takes for this flag signal to generate. If it is slower than expectation, the pump clock frequency is increased to place the ramp rate into a desired range—that is, increased to be high enough, but also not too fast. Hence, the design can have a consistent ramp rate of pump output across die-to-die or lot-to-lot transistor variations.

Figure 2:
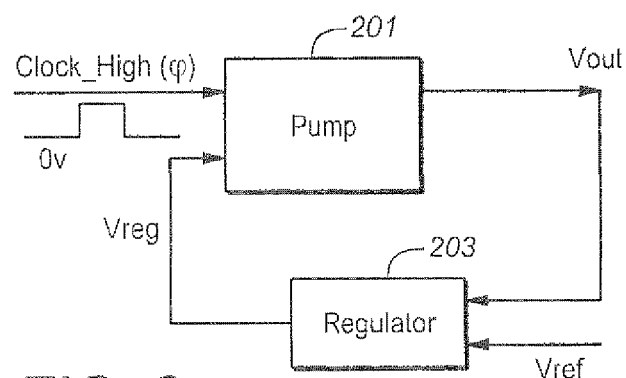
FIG. 2 is a top-level block diagram for a regulated charge pump.

FIG. 2 is a top-level block diagram of a typical charge pump arrangement. As shown in FIG. 201, the charge pump 201 has as inputs a clock signal and a voltage Vreg and provides an output Vout. The voltage Vreg is provided by the regulator 203, which has as inputs a reference voltage Vref and Vout. The regulator block 203 regulates the value of Vreg such that k*Vout=Vref, where, by adjusting the value of k, the desired value of Vout can be obtained. The value k can be implemented as, for example, a resistor ratio and is typically adjusted through a digital to analog converter, as will be familiar in the art. (Although not shown, the regulator (203) will also be connected to receive the voltage Vext from the external power supply to the chip.) Regulator 203 can take other supply voltages, not just Vext. Vref is a fixed reference value, such as provided by band-gap generator (not shown) with a voltage of, say, 1.2 volts. Clock_High is a clock (not shown) input to the Pump 201.

More information on prior art charge pumps, such Dickson type pumps and charge pumps generally, can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,801,454; 6,922,096; 7,030,683; 7,135,910; 7,372,320; 7,368,979; 7,443,735; and 7,440,342; US patent publications 2007-0139099-A1 and 2008-0024096-A1; and application Ser. No. 10/842,910 filed on May 10, 2004; Ser. No. 11/295,906 filed on Dec. 6, 2005; Ser. No. 11/303,387 filed on Dec. 16, 2005; Ser. No. 11/497,465 filed on Jul. 31, 2006; Ser. No. 11/523,875 filed on Sep. 19, 2006; Ser. Nos. 11/845,903 and 11/845,939, both filed Aug. 28, 2007; Ser. Nos. 11/955,221 and 11/995,237, both filed on Dec. 12, 2007; and Ser. No. 12/135,945, filed Jun. 9, 2008.

When operating, the charge pump tries to accurately maintain Vout at the desired level as part of the regulation process. However, when the output is initially connected to drive a load, Vout will typically drop below the desired value and then come back up and recover to the desired value (the recovery phase). Once back up to the desired range for Vout, the pump tries to maintain the output in this range (the regulation phase). In the prior art, pumps are generally designed to recovery as quickly as is practically possible—or, perhaps more typically, to at least recover more quickly than some minimum value—since the purpose of the charge pump is to maintain the desired Vout value while supply the needed current.

Figure 3:
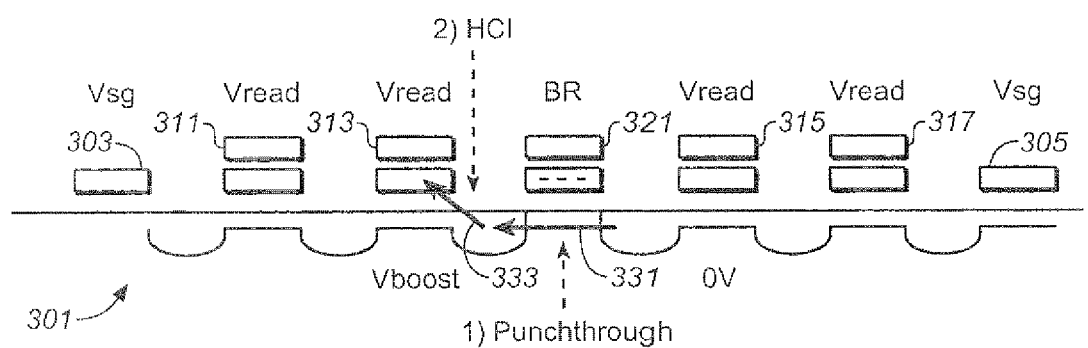
FIG. 3 illustrates how a possible read disturb can occur from a charge pump having too rapid a ramp rate during its recovery phase.

The output of the pump will be typically be used by many elements on a device. Thus, in previous charge pump arrangements, the pump design would be optimized to meet a given recovery specification for the worst case conditions. All of the timing parameters would correspondingly be optimized in these worst conditions, as having too slow a recovery specification would negatively affect device performance. As noted above, however, as the output of the charge pump is delivered to elements of the circuit with differing loads and connected to the pump by different paths, the resultant ramp rate for a given pump clock frequency can differ; and, as also noted above, it is found that too fast a ramp rate could affect the reliability of a device. FIG. 3 can be used to illustrate an example of this effect.

FIG. 3 shows some EEPROM memory cells arranged into a NAND string. (More detail for various examples of non-volatile memory systems with such an arrangement of cells can be found in U.S. Pat. No. 7,120,051 or U.S. patent application Ser. No. 11/759,909, for example, which are wholly incorporated by reference here and which can referred to in order to provide context for the simplified discussion given here.) In FIG. 3, a string of, here, five floating gate transistors (311, 313, 321, 315, and 317) are arranged in series on a substrate 301 between a pair of select transistors 303 and 305. In a read operation of the cell 321, the select gates 303 and 305 on either end of the string are turned on using a select gate voltage of Vsg. In FIG. 3, the memory cell selected for sensing is cell 321 in the center of the string. In this example, a voltage BR is applied to the control gate of cell 321. In order to the conduction of cell 321 at this control gate voltage, the other memory cells (311, 313, 315, 317) in the string must be turned fully on, regardless of the data pattern stored on these cells, so that they do not affect the determination of the state on selected cell 321. The voltage applied to these non-selected cells 311, 313, 315, 317 is labeled Vread. As the value of Vread should be sufficiently high enough to turn on a memory cell for any of the data levels (here corresponding to amount of charge stored on the floating gate) the cells may hold, this level is often provided by a charge pump.

In actual implementation, the voltage level on the non-selected memory cells will naturally not instantaneously go to Vread. As the voltage is supplied from the pump, the output of the pump will be pulled down as this load is applied, go into recovery mode, and ramp back up to regulated level of Vread. As the path (through selection circuits, multiplexers, etc.) from the pump to the corresponding word lines may not all be the same, the actual values on the non-selected cells as they ramp up to Vread can vary. This difference in ramp rate between different wordlines can lead to a localized boosting, particularly for some data patterns. This can lead to a large drain-source voltage difference across some devices, with a boosted voltage Vboost on one side while the other side is at ground, and lead to punch-through and hot carrier injection into cell 313. To resolve this type of read disturb possibility, the pump clock frequency can be set slower, so that the maximum such ramp rate of the pump output is controlled by the pump, instead of just being limited by RC parasitics between the pump and the control gate of the cells. In addition to setting the pump clock frequency, optimization of the device may also include altering other timing parameters on the device accordingly.

Figure 4:
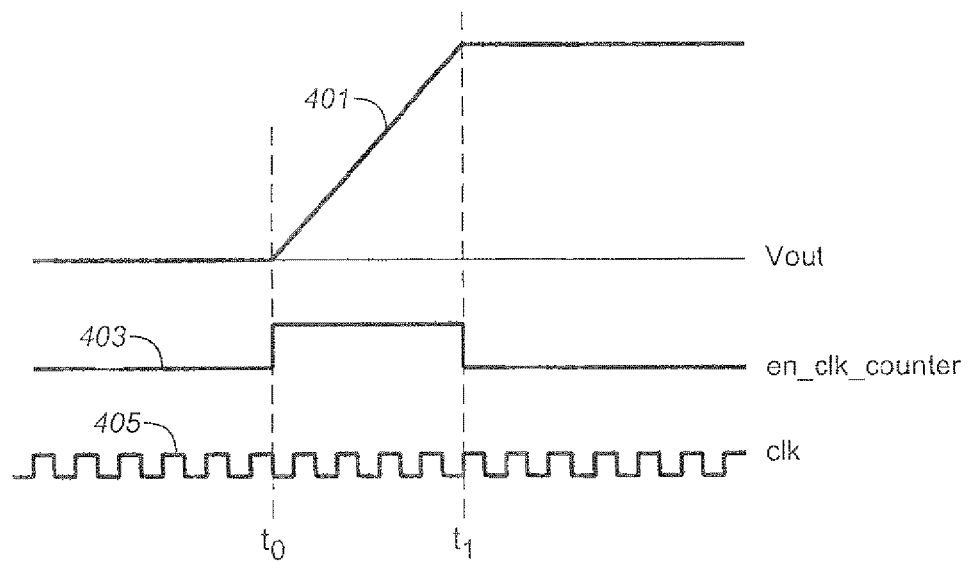
FIG. 4 illustrates a method of determining the recovery time in a charge pump system.

An exemplary method determination of the ramp rate for the charge pump can be illustrated using FIG. 4. In FIG. 4, the waveform 401 represents Vout from the charge pump. Between t0 and t1 the pump is in recovery phase, ramping up to level at the regulation phase from where it had dropped to when connected to the load. To determine how long it takes for the pump output to recover, the number of clock cycles (the waveform elk 403) between t0 and t1 are counted. This can be done by a counter which is started when an enable signal (the waveform en_elk_counter 405) is asserted at t0 and de-asserted when it determines the regulation level has been reached at t1. As the clock frequency is known, the recovery time can be determined and adjusted as needed to put the ramp rate into the desired range by a process such as that of the flow of FIG. 5.

Figure 5:
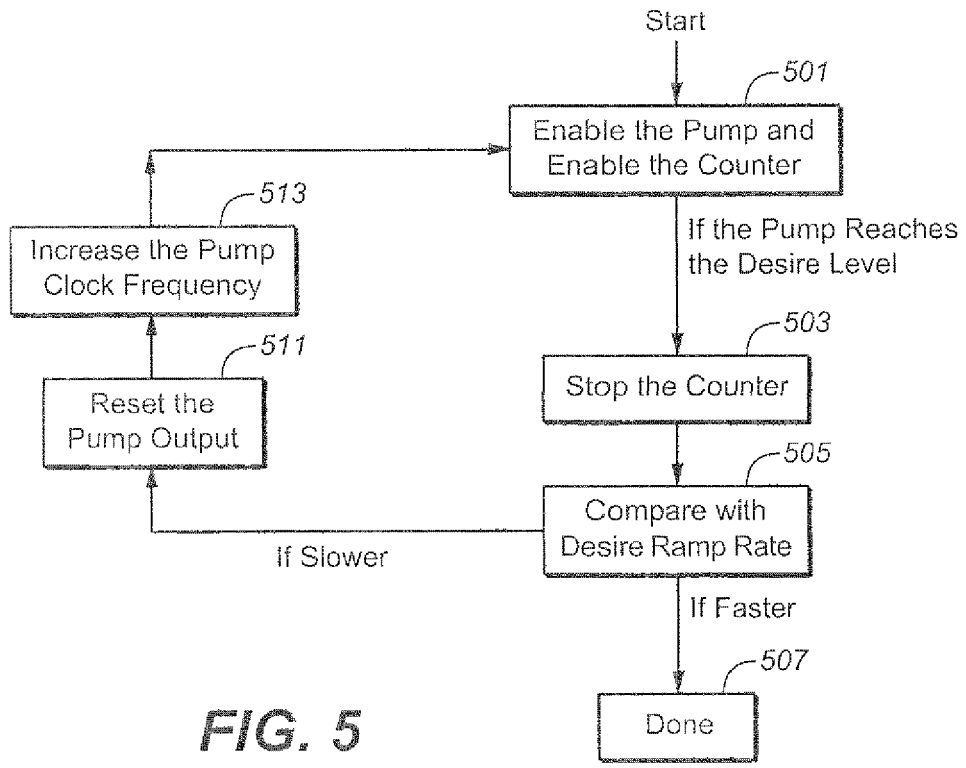
FIG. 5 shows an exemplary flow for the trimming of the clock rate for a charge pump.

FIG. 5 is an exemplary flow for setting the pump clock frequency. In this embodiment, the trimming process starts with the clock frequency slow enough so that maximum ramp rate is not exceeded and then incrementally increased as needed to be above the minimum rate, where the step size of increment is small enough to avoid overshooting the upper rate.

After starting the process, the pump and the counter are enabled at 501. This correspond to the signal en_clk_counter 403 of FIG. 4 going high at time t0. Once the output of the pump reaches the desired output, corresponding to time t1 of FIG. 4, the counter is stopped at 503. As both the number of clock cycles needed for the pump output to recover and the clock frequency are known, the ramp rate can be determined and compared with the desired ramp rate at 505. The maximum and minimum ramp rates can be predetermined values, or, in some embodiments, can be dynamically determined; for example, these values could be determined by the controller's firmware based, say, on the rate of read disturbs. If the ramp rate is determined to be faster than the minimum end of the desired range, the clock frequency is acceptable and the process ends (507). If not, the clock frequency is adjusted, the pump reset, and the ramp rate checked again.

In the flow of FIG. 5, the pump is reset at 511 and the clock frequency adjusted at 513. Although FIG. 5 shows the pump reset first, more generally the order of 511 and 513 can be changed or both can be done at the same time, as long as the are both done before returning to 501. As the embodiment of FIG. 5 starts with clock frequency slow enough so that the ramp rate will not exceed the maximum desired rate, the clock frequency is increased at 513, with the increment size being small enough the it will not cause overshoot. Once the pump is reset and the frequency adjusted, the process goes through 501, 503, 505 again, either ending at 507 or going through another iteration if needed.

A number of variations on the process of FIG. 5 could alternately be used. For example, the initial clock frequency could be taking high enough to have the ramp rate above the minimum of the desired range and then checked at 505 to see whether ramp is below the maximum. In this case, the clock rate would instead be incrementally decreased at 513 if the comparison of 505 found the ramp rate too fast. More generally, the comparison of 505 could check the ramp rate against both the upper and lower values for the desired range and adjust either up or down at 513 as appropriate. In any of the variations, the step size for the increment at 513 can be fixed for all needed iterations or variable, but in any case the change should not be so great so at to take the ramp rate from too slow to too fast (or vice versa) in a single iteration of 513. Also, the process here is primarily described in terms of an initial trimming operation done before the device is sent out to users, it can also be implemented as part of a dynamic process. For example, going back to the exemplary application as a peripheral circuit on a non-volatile memory, if the controller finds a relatively large amount of error that could be due to read disturb, the trimming process could be invoked and the pump clock frequency reset as needed. As noted above, there may be other parameters on the system where the charge pump is being used that would be adjusted based on the clock frequency, but as these will be specific to application, these are not included in the flow of FIG. 5.

Figure 6:
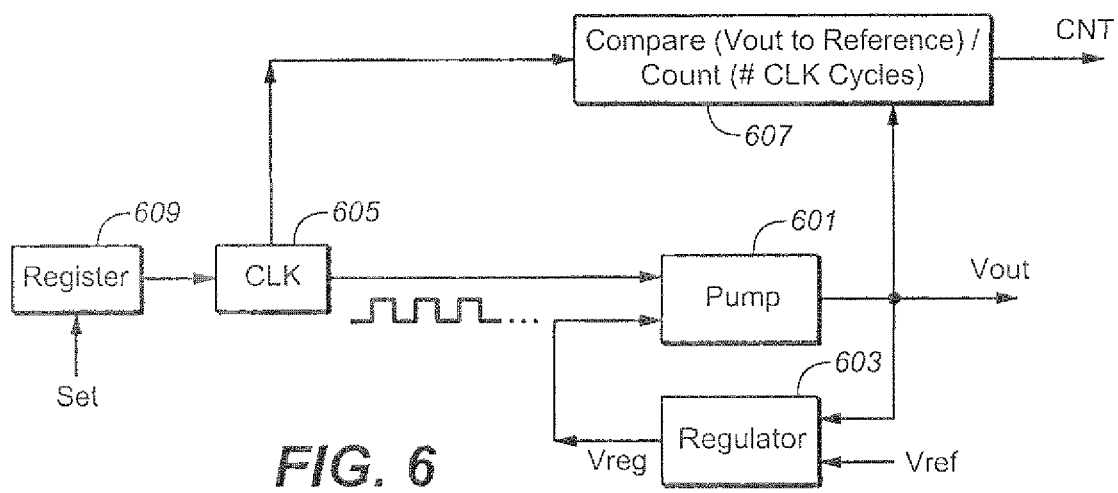
FIG. 6 shows some components in an exemplary embodiment of a trimmable charge pump system.

FIG. 6 is a bock diagram of some of the elements in an embodiment of a pump system with a trimmable clock frequency. The pump 601 and regulator 603 respectively correspond to pump 201 and regulator 203 of FIG. 2 and can be any of the various designs, such as those in the references cited above. The clock CLK 605 provides the clock signal to the pump at a frequency dependent of the value set in the register 609. Both pump output Vout and the clock frequency are supplied to the compare/count block 607, which can implemented in hardware, firmware, or some combination of these. When the en_clk_counter signal (403, FIG. 4) is asserted at t0, the pump 601 ramps up while the compare/count block 607 keeps track of the number clock cycles while comparing Vout against the reference value, outputting the value CNT to indicate the number cycles between t0 and t1. (The connection of the control signal en_clk_counter to pump 601 and compare/count element 607 is not shown.) As the number of clock cycles and the clock frequency are known, the ramp rate can be determined and the value of the register 609 adjusted as needed, indicated by the input SET. The discussion here has mainly been in the context of an initial trimming process, where the CNT signal is read out and the SET value for the register 609 set from outside. In other embodiments, the value of SET could be determined on the system itself: for example, this function could be schematically included in the block 607, which would provide SET to the register 609. (Although shown combined in FIG. 6, the various functions described for block 607 could be distributed over several elements according to the implementation.)

Although the charge pump system described above can implemented as a separate circuit, it will typically occur as a peripheral element on a larger system. Returning to the example of a non-volatile memory system, such system are commonly formed of a controller chip and one or more memory chips. Although the charge pump can be on the controller or a separate chip, it is more commonly formed as a peripheral element on one or more memory chips. As all of the memory chips are usually the same, they would all have a pump circuit, although some of these may be disabled so that one or more of the chips will supply other chips. In such system, the pump 601, regulator 603, and maybe also the clock CLK 605 and register 609 could be placed on a memory chip, with the compare/count elements on either the controller or the memory chip, although other embodiments can distribute these elements differently.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A method of setting a frequency of a clock for a charge pump system including said clock and a charge pump, the method comprising:

setting an initial value for the frequency of the clock;

while operating the charge pump system using the clock running at the initial frequency value, determining the ramp rate of an output voltage for the charge pump during a recovery phase; and based upon the determined ramp rate, subsequently adjusting the frequency of the clock so that the ramp rate of the output voltage for the charge pump during the recovery phase falls in a range not exceeding a maximum rate, wherein determining the ramp rate of the output voltage for the charge pump during a recovery phase includes counting the a number of clock cycles the output voltage requires to reach a reference value.

2. The method of claim 1, wherein the clock frequency is adjusted so that the range is above a minimum rate.

3. The method of claim 1, wherein in the charge pump system includes a non-volatile register whose value governs the clock frequency, the method further comprising:

setting the register value according to the adjusted clock frequency.

4. The method of claim 1, wherein the method is performed as part of an initial trimming process.

5. A method of setting a frequency of a clock for a charge pump system including said clock and a charge pump, the method comprising:

setting an initial value for the frequency of the clock;

while operating the charge pump system using the clock running at the initial frequency value, determining the ramp rate of an output voltage for the charge pump during a recovery phase; and based upon the determined ramp rate, subsequently adjusting the frequency of the clock so that the ramp rate of the output voltage for the charge pump during the recover base falls in a range not exceeding a maximum rate, wherein determining the ramp rate includes:

maintaining a count of a number of clock cycles; and determining the value of the count at which the output voltage reaches a reference level.

6. The method of claim 1, wherein adjusting the frequency includes:

performing a first adjustment of the frequency;

while operating the charge pump system using the clock running at the first adjusted frequency value, determining the ramp rate of the output voltage for the charge pump during a recovery phase; and further adjusting the frequency of the clock.

7. The method of claim 1, wherein adjusting the frequency includes increasing the clock frequency.

8. The method of claim 1, wherein adjusting the frequency includes decreasing the clock frequency.

9. The method of claim 1, wherein the charge pump is a peripheral element on a circuit, the method further comprising:

subsequent to adjusting the frequency of the clock, adjusting one or more operating parameters on the circuit based upon the value to which the clock frequency is adjusted.

10. A charge pump system, comprising:

a clock circuit to provide a clock signal;

a charge pump to provide an output voltage, the charge pump connected receive the clock signal and operate at the frequency thereof;

a regulator circuit connected receive the output voltage and provide a regulation voltage derived therefrom to the charge pump;

a register having a settable value, where the clock frequency is responsive to the register value; and count and comparison circuitry connectable to receive the output voltage and the clock signal and determine therefrom a number of clock cycles the charge pump uses to recover from a reset value to a predetermined value.

11. The charge pump system of claim 10, wherein the number of clock cycles the charge pump uses to recover is accessible from externally to the charge pump system and the register value is settable from externally to the charge pump system.

12. The charge pump system of claim 10, further comprising:

logic circuitry connectable to receive the number of clock cycles the charge pump uses to recover, determine the ramp rate of the charge pump during recovery, and adjust the register values in response to said ramp rate.

13. The charge pump system of claim 10, wherein the charge pump is a peripheral circuit on a non-volatile memory chip.

* * * * *

UNITED STATES PATENT AND TRADEMARK OFFICE
CERTIFICATE OF CORRECTION

PATENT NO. : 7,795,952 B2
APPLICATION NO. : 12/337050
DATED : September 14, 2010
INVENTOR(S) : Lui et al.

It is certified that error appears in the above-identified patent and that said Letters Patent is hereby corrected as shown below:

Col. 7; In Claim 1, line 18, please delete "counting the a number" and insert -- counting a number --.

Col. 7; In Claim 5, line 43, please delete "recover base" and insert -- recovery phase --.

Signed and Sealed this

Ninth Day of November, 2010

David J. Kappos
*Director of the United States Patent and Trademark Office*